United States Patent
Mizoguchi et al.

(10) Patent No.: US 8,537,447 B2
(45) Date of Patent: Sep. 17, 2013

(54) ACTUATOR, OPTICAL SCANNER AND IMAGE FORMING APPARATUS

(71) Applicant: Seiko Epson Corporation, Tokyo (JP)

(72) Inventors: Yasushi Mizoguchi, Chino (JP); Mitsuhiro Yoda, Shiojiri (JP); Makiko Nakamura, Suwa (JP)

(73) Assignee: Seiko Epson Corporation, Tokyo (JP)

(*) Notice: Subject to any disclaimer, the term of this patent is extended or adjusted under 35 U.S.C. 154(b) by 0 days.

(21) Appl. No.: 13/711,817

(22) Filed: Dec. 12, 2012

(65) Prior Publication Data
US 2013/0107337 A1 May 2, 2013

Related U.S. Application Data

(63) Continuation of application No. 11/852,107, filed on Sep. 7, 2007, now Pat. No. 8,355,191.

(30) Foreign Application Priority Data

Sep. 8, 2006 (JP) ................... 2006-244878

(51) Int. Cl.
G02B 26/08 (2006.01)
(52) U.S. Cl.
USPC ........................................ 359/198.1
(58) Field of Classification Search
USPC ............... 359/223.1–226.1, 871, 872, 198.1, 359/199.1
See application file for complete search history.

(56) References Cited

U.S. PATENT DOCUMENTS 7,639,413 B2 * 12/2009 Nishikawa et al. ........ 359/224.1

FOREIGN PATENT DOCUMENTS

| JP | 06-105569 A | 4/1994 |
|---|---|---|
| JP | 07-261100 A | 10/1995 |
| JP | 10-031269 A | 7/1996 |
| JP | 2004-191953 A | 7/2004 |
| JP | 2004-361889 A | 12/2004 |
| JP | 2005-229380 A | 8/2005 |
| JP | 2005-326464 A | 11/2005 |
| JP | 2006-081320 A | 3/2006 |

\* cited by examiner

*Primary Examiner* — Euncha Cherry
(74) *Attorney, Agent, or Firm* — Maschoff Brennan

(57) ABSTRACT

An actuator includes a mass section; a support section; a coupling section for coupling the mass section rotatably to the support section so as to support the mass section with cantilever structure; and a pair of driving sources including a piezoelectric element for rotating the mass section, wherein the pair of driving sources are provided separately from each other with respect to a central axis of rotation of the mass section, each of the driving sources is provided slidably with respect to the coupling section or the support section, and the actuator is structured such that it causes the pair of piezoelectric elements to expand and contract in phases opposite to each other, so as to rotate at least a part of the coupling section while torsionally deforming the mass section.

13 Claims, 9 Drawing Sheets

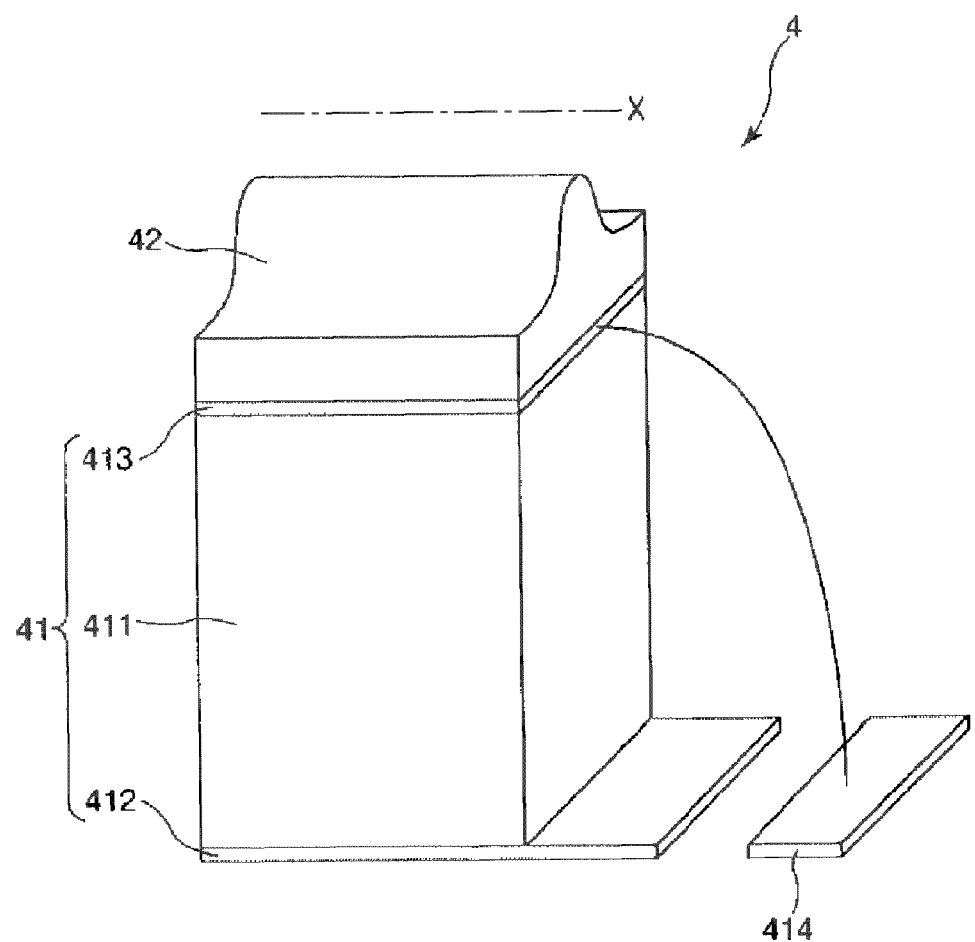
FIG. 4
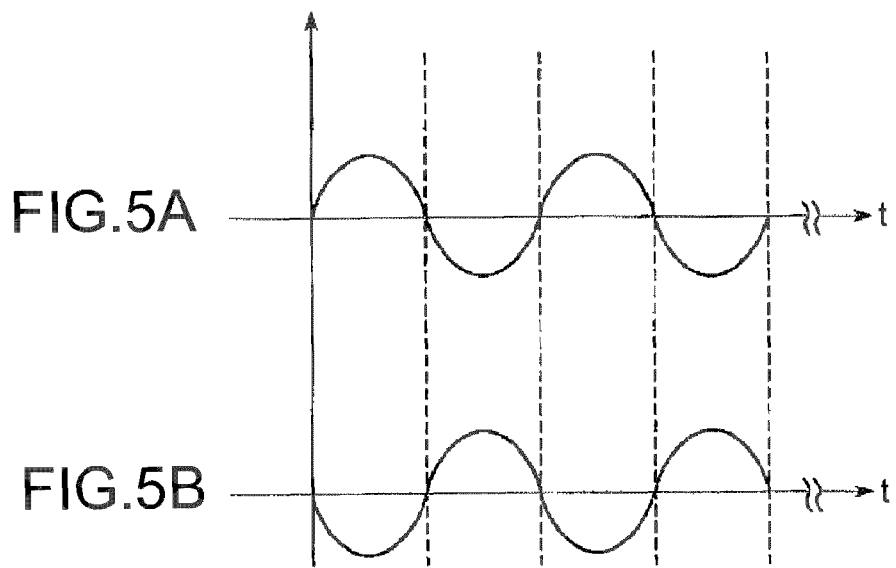
FIG.5A
FIG.5B

ACTUATOR, OPTICAL SCANNER AND IMAGE FORMING APPARATUS

This application is a Continuation of U.S. application Ser. No. 11/852,107, filed Sep. 7, 2007, which claims priority to Japanese Application No. 2006-244878, filed Sep. 8, 2006. The foregoing patent applications are incorporated herein by reference.

BACKGROUND

1. Technical Field

The present invention relates to an actuator, an optical scanner and an image forming apparatus.

2. Related Art

As an optical device for drawing by optical scanning using a laser printer or the like, various devices have been known in the related art. These devices include an optical device which uses an actuator including a torsional vibrator. (JP-A 2004-191953 is an example of related art.)

JP-A-2004-191953 discloses an actuator including a torsional vibrator of one-degree-of-freedom vibration system. The actuator includes a reflective mirror, a fixed frame section for supporting the reflective mirror, and a pair of spring sections for coupling the reflective mirror to the fixed frame section. The pair of spring sections are provided so as to support the reflective mirror from the both sides of the reflective mirror.

Each of the spring sections has a first spring section for coupling the reflective mirror to the coupled body, and a second spring section for coupling the fixed frame section to the coupled body. In addition, the second spring section includes a pair of elastic bodies which are provided so as to be opposed to each other with respect to a central axis of rotation. That is, the spring section is structured such that the spring is branched into two at a middle point thereof.

To each of the second spring sections, there is joined a piezoelectric element (driving source) such that it expands and contracts in the longitudinal direction thereof. The actuator applies voltage to the piezoelectric element and causes the piezoelectric element to expand and contract, causing bending deformation of the second spring section. Along with the deformation, the actuator torsionally deforms the first spring section so as to rotate the reflective mirror, and reflects and scans a light beam. This enables drawing by optical scanning.

In this case, since the piezoelectric element joined to each of the spring sections generates heat caused by driving (voltage application) thereof, the temperature at the spring section is forced to increase. The increase in temperature causes the spring section to expand. However, since the actuator according to JP-A-2004-191953 has a dual-support beam (dual support) structure, it does not enable permitting change in shape of the spring section caused by expansion. This results in a rapid change in a spring constant of the pair of spring sections and distortion of the entire actuator, which disables maintaining stable driving of the actuator.

Particularly, in the case where the actuator is used as an optical scanner like the actuator in JP-A-2004-191953, the drawback as described above becomes notable. Specifically, when the actuator scans a light beam, the reflective mirror reflects most of the irradiated light beam. However, it is impossible to make optical reflectivity by the reflective mirror 100%. In such an actuator, a part of the light beam which has been irradiated to the reflective mirror turns to heat, increasing the temperature of the actuator. The increased temperature of the actuator causes the drawback as described above.

In addition, thermal expansion of the spring section caused by the increased temperature displaces the central axis of rotation of the reflective mirror. This displacement results in a drawback that the actuator cannot have desired scan characteristics.

Based on what has been described above, the actuator according to JP-A-2004-191953 has a drawback that it cannot maintain desired scan characteristics in the case where it is used for a long period of time.

SUMMARY

An advantage of the invention is to provide an actuator, an optical scanner and an image forming apparatus which enables maintaining stable driving thereof even in the case where it is used continuously for a long period of time.

Such advantage is achieved by the inventions as described above.

According to an aspect of the invention, an actuator includes a mass section; a support section; a coupling section for coupling the mass section rotatably to the support section so as to support the mass section with cantilever structure; and a pair of driving sources including a piezoelectric element for rotating the mass section. In the actuator, the pair of driving sources are provided separately from each other with respect to a central axis of rotation of the mass section, each of the driving sources is provided slidably with respect to the coupling section or the support section, and the actuator is structured such that it causes the pair of piezoelectric elements to expand and contract in phases opposite to each other, so as to rotate at least a part of the coupling section while torsionally deforming the mass section.

This enables permitting displacement of the coupling section caused by thermal expansion in the direction parallel to the central axis of rotation of the mass section. This results in preventing a rapid change in a spring constant of the coupling section, and further enables keeping the central axis of rotation of the mass section fixed. Accordingly, the actuator is capable of having desired vibration characteristics, even in the case where heat generated by the piezoelectric element has increased the temperature of the actuator. That is, the actuator is capable of maintaining desired vibration characteristics even in the case where it is used continuously for a long period of time.

It is preferable that, each of the driving sources be secured to the support section and further include a sliding member between the piezoelectric element and the coupling section, and the sliding member be joined to the piezoelectric element on which it is provided and be slidable with respect to the coupling section.

Provision of such sliding members enables increasing the degree of freedom in design, such as a contact position between each of the driving sources and the coupling section and a shape of the contact portion or the like, and enables achieving desired sliding performance between the coupling section and the each of the driving sources.

It is preferable that the sliding member has a lower heat conductivity than a primary component of the piezoelectric element.

This enables suppressing transmission to the piezoelectric element of heat generated from the piezoelectric element caused by applying voltage (i.e., causing the piezoelectric element to expand and contract). This results in enabling suppressing the coupling section from being deformed.

It is preferable that surface treatment be provided on a surface of an abutting section of each of the driving sources with the coupling section and/or a surface of the abutting section of the coupling section with each of the driving sources to enhance sliding performance.

This enables enhancing sliding performance between the coupling section and the driving source.

It is preferable that the coupling section have a plate-shaped drive section, a first elastic section for coupling the drive section rotatably to the first support section, and a second elastic section for coupling the mass section rotatably to the drive section, and each of the driving sources be provided slidably with respect to the drive section.

Such a structure enables causing the pair of driving sources to expand and contract in phases opposite to each other, rotating the drive section while torsionally deforming the first elastic section, and, along with the rotation, rotating the mass section while torsionally deforming the second elastic section. This results in making the rotation angle of the mass section larger even in the case where the rotation angle of the drive section is small.

It is preferable that each of the driving sources make a point contact with the drive section, or make a line contact therewith so that it extends in a direction parallel to the central axis of rotation of the mass section.

This enables, during rotation of the drive section, maintaining the contact area between the drive section and the driving source substantially constant and smoothly rotating the drive section.

It is preferable that each of the driving sources makes a line contact with the entire area of the central axis of rotation of the mass section in the direction parallel to the drive section.

This enables uniformly applying driving force of each driving source caused by expansion and contraction each piezoelectric element on the entire area of the drive section in the direction parallel to the central axis of rotation of the mass section.

It is preferable that the pair of driving sources be provided substantially symmetrically with each other with respect to the central axis of rotation of the mass section in plan view of the drive section.

This enables rotating the drive sections symmetrically with each other with respect to the central axis of rotation of the mass section.

It is preferable that the elastic section have a pair of elastically deformable elastic members that are opposed to each other with respect to the central axis of rotation of the mass section, the pair of driving sources be provided corresponding to the pair of elastic members, and the driving source and the elastic member that correspond to each other be slidably provided.

Such a structure enables rotating the mass section while keeping the central axis of rotation fixed.

It is preferable that each of the driving sources make a point contact with the elastic member.

This enables, during rotation of the drive section, maintaining the contact area between the drive section and the driving source substantially constant and smoothly rotating the drive section.

The actuator according to any one of claims 1 to 10, wherein the mass section includes a light reflective section having light reflectivity.

It is preferable that the mass section include a light reflective section having light reflectivity.

This enables using the actuator as an optical device.

According to another aspect of the invention, an optical scanner includes: a mass section; a support section; a coupling section for coupling the mass section rotatably to the support section so as to support the mass section with cantilever structure; and a pair of driving sources including a piezoelectric element for rotating the mass section. In the optical scanner, the pair of driving sources are provided separately from each other with respect to a central axis of rotation of the mass section, each of the driving sources is provided slidably with respect to the coupling section or the support section, and the optical scanner is structured such that it causes the pair of piezoelectric elements to expand and contract in phases opposite to each other, so as to rotate at least a part of the coupling section while torsionally deforming the mass section, and scans a light beam reflected by the light reflective section.

This enables permitting displacement of the coupling section caused by thermal expansion in the direction parallel to the central axis of rotation of the mass section. This results in preventing a rapid change in a spring constant of the coupling section, and further enables keeping the central axis of rotation of the mass section fixed. Accordingly, the optical scanner is capable of having desired vibration characteristics, even in the case where heat generated by the piezoelectric element has increased the temperature of the optical scanner. That is, the optical scanner is capable of maintaining desired vibration characteristics even in the case where it is used continuously for a long period of time.

According to a further aspect of the invention, an image forming apparatus includes an optical scanner including: a mass section; a support section; a coupling section for coupling the mass section rotatably to the support section so as to support the mass section with cantilever structure; and a pair of driving sources including a piezoelectric element for rotating the mass section. In the optical scanner, the pair of driving sources are provided separately from each other with respect to a central axis of rotation of the mass section, each of the driving sources is provided slidably with respect to the coupling section or the support section, the scanner is structured such that it causes the pair of piezoelectric elements to expand and contract in phases opposite to each other, so as to rotate at least a part of the coupling section while torsionally deforming the mass section, and scans a light beam by the light reflective section.

This enables providing an image forming apparatus having superior drawing characteristics.

BRIEF DESCRIPTION OF THE DRAWINGS

The invention will be described with reference to the accompanying drawings, wherein like numbers reference like elements.

FIG. 4 is an expanded view of a driving source.

FIGS. 5A and 5B are drawings showing one example of a waveform of voltage for driving the actuator shown in FIG. 1.

DESCRIPTION OF EXEMPLARY EMBODIMENTS

Preferable embodiments of an actuator according to the invention will now be described with reference to the attached drawings.

Embodiment 1

First, Embodiment 1 of the actuator according to the invention will be described.

Figure 1:
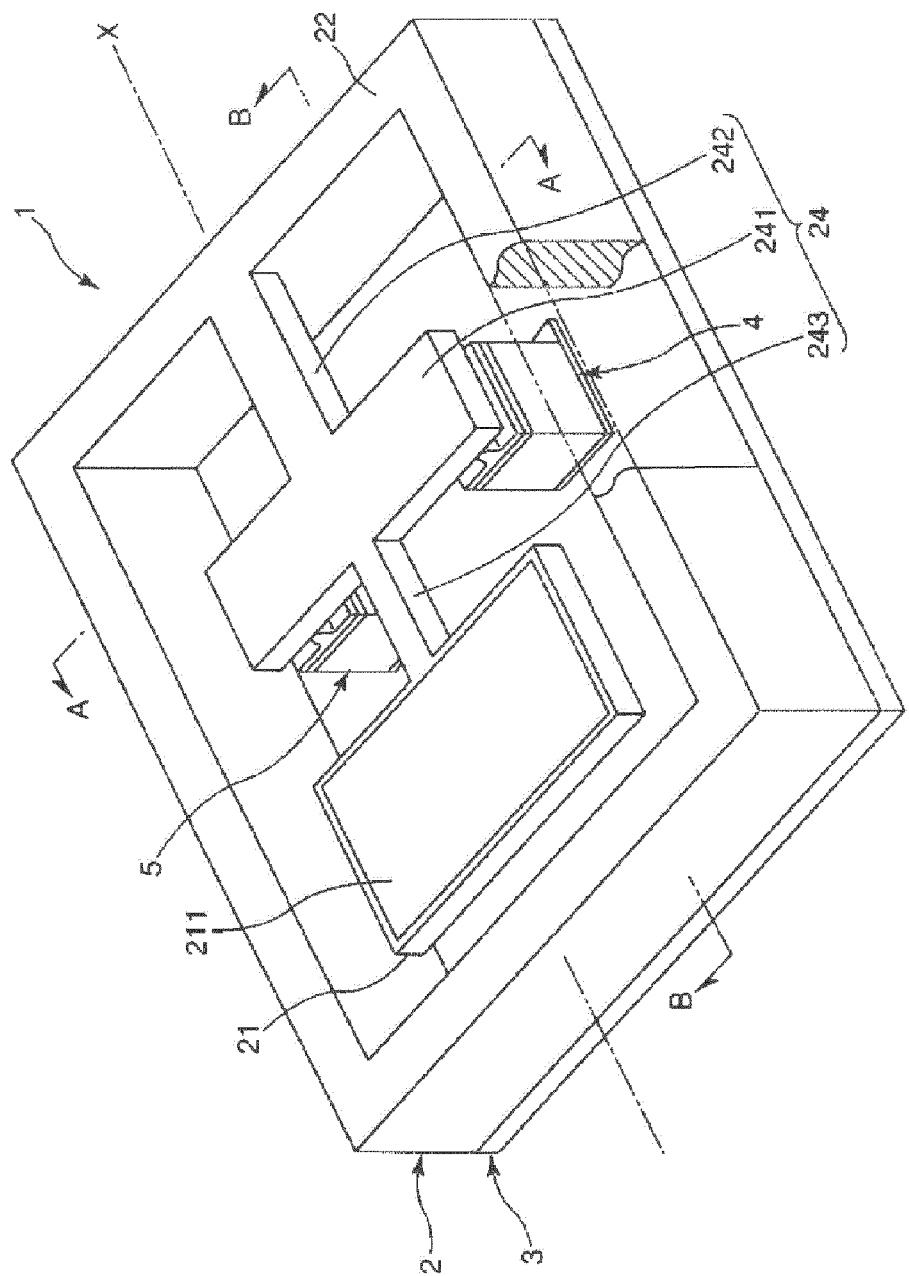
FIG. 1 is a perspective view showing Embodiment 1 of the actuator according to the invention.
Figure 2:
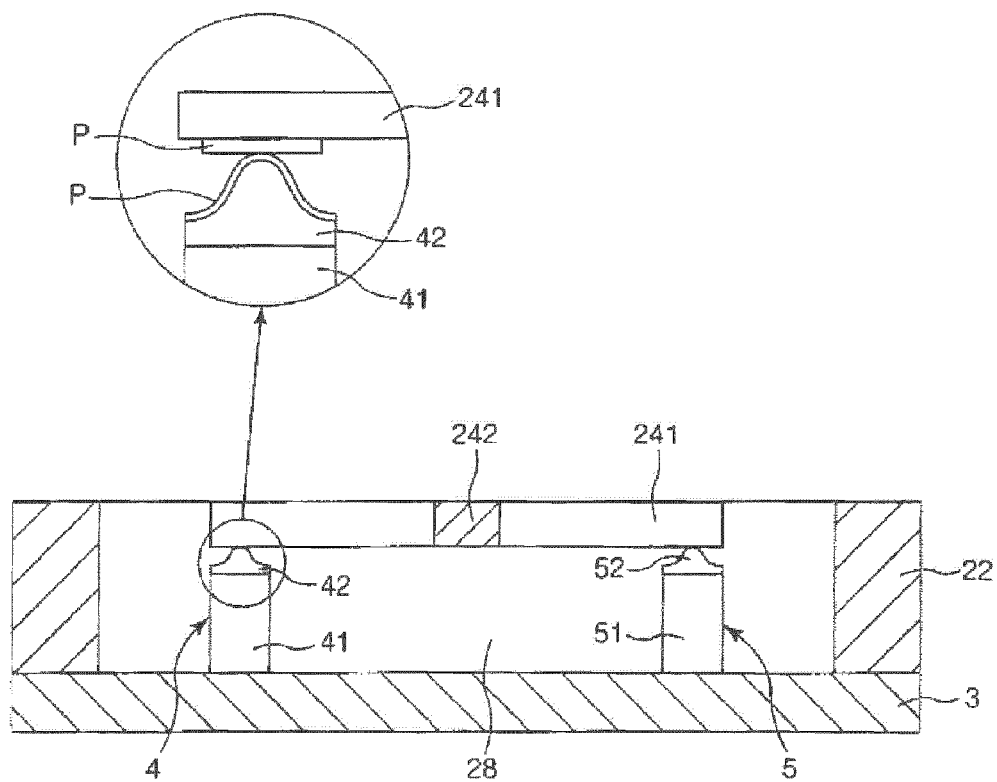
FIG. 2 is a sectional view cut along Line A-A in FIG. 1.
Figure 3:
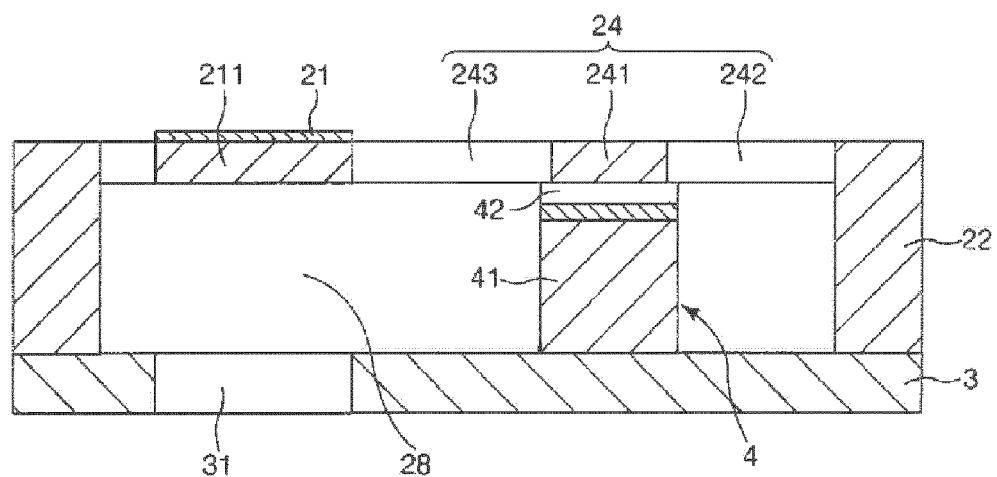
FIG. 3 is a sectional view cut along Line B-B in FIG. 1.

FIG. 1 is a perspective view showing Embodiment 1 of the actuator according to the invention, FIG. 2 is a sectional view cut along Line A-A in FIG. 1, FIG. 3 is a sectional view cut along Line B-B in FIG. 1, FIG. 4 is an expanded view of a driving source, and FIG. 5 is drawing showing one example of a waveform of voltage for driving the actuator shown in FIG. 1.

Hereinafter, for convenience of description, in FIG. 1, the front side of a plane of the drawing will be referred to as "top," the back side thereof as "bottom," the right side thereof as "right," and the left side thereof as "left." In FIGS. 2 and 3, the top side of a plane of the drawing will be referred to as "top," the bottom side thereof as "bottom", the right side thereof as "right," and the left side thereof as "left."

An actuator 1 has a base body 2 having a two-degree-of-freedom vibration system as shown in FIG. 1, a pair of driving sources 4, 5 for driving the two-degree-of-freedom vibration system of the base body 2, and a support substrate for supporting the driving sources 4, 5.

The base body 2 includes a plate-shaped mass section 21, a support section 22 for supporting the mass section 21, and a coupling section 24 for supporting the mass section 21 with cantilever structure. In addition, the coupling section 24 includes a plate-shaped drive section 241, a first elastic section 242, and a second elastic section 243. That is, the base body 2 includes the mass section 21, the support section 22, the drive section 241, the first elastic section 242 and the second elastic section 243.

In such an actuator 1, application of voltage to piezoelectric elements 41, 51 which will be described later causes the piezoelectric elements 41, 51 to expand and contract in phases opposite to each other (i.e., in the opposite directions), and rotates the drive section 241 while torsionally deforming the first elastic section 242. Along with the rotation, the actuator 1 rotates the mass section 21 while torsionally deforming the second elastic section 243. At this time, the drive section 241 and the mass section 21 are rotated centering around a central axis X of rotation shown in FIG. 1, respectively.

On a top surface (that is, a surface opposite to the support substrate 3) of the mass section 21, there is provided a light reflective section 211 having light reflectivity.

The mass section 21 and the drive section 241 are provided such that the drive section 241 is connected to the support section 22 via the first elastic section 242, and the mass section 21 is connected to the drive section 241 via the second elastic section 243.

The first elastic section 242 couples the drive section 241 to the support section 22 so as to make the drive section 241 rotatable with respect to the support section 22.

The second elastic section 243 couples the mass section 21 to the drive section 241 so as to make the mass section 21 rotatable with respect to the drive section 241.

Such first elastic section 242 and second elastic section 243 are coaxiallly provided, and they serve as the central axis of rotation X (axis of rotation), around which the drive section 241 is rotatable with respect to the support section 22, and the mass section 21 is rotatable with respect to the drive section 241.

In addition, the base body 2 has a first vibration system including the drive section 241 and the first elastic section 242, and a second vibration system including the mass section 21 and the second elastic section 243. Specifically, the base body 2 has a two-degree-of-freedom vibration system which includes the first vibration system and the second vibration system.

Such a two-degree-of-freedom vibration system is formed thinner than a total thickness of the base body 2, and is located above the base body 2 in the vertical direction in FIG. 2. In other words, on the base body 2, there is formed a portion which is thinner than the total thickness of the base body 2. The mass section 21, the drive section 241, the first elastic section 242 and the second elastic section 243 are formed by formation of holes with different shapes in the thinner portion.

According to the Embodiment 1, since the top surface of the thinner portion is located in the same plane as the top surface of the support section 22, a space (concave section) 28 for rotating the mass section 21 and the drive section 241 is formed below the thinner portion.

Such base body 2 is primarily made of, for example, silicon, and is integrally formed by the mass section 21, the drive section 241, the support section 22, the first elastic section 242 and the second elastic section 243. As described above, use of silicon as the main material enables achieving superior rotational characteristics and having superior durability. In addition, this enables micro processing (or micro fabrication) and reducing the size of the actuator 1.

Note that the base body 2 may have a structure such that the mass section 21, the drive section 241, the support section 22, the first elastic section 242 and the second elastic section 243 are formed from a substrate having a laminated structure such as a silicon-on-insulator (SOI) substrate. For doing this, it is preferable that the mass section 21, a part of the support section 22, the drive section 241, the first elastic section 242 and the second elastic section 243 are formed into a single layer of a substrate with a laminated structure so that they are integrated.

Such base body 2 is supported by the support substrate 3 primarily made of, for example, glass or silicon.

In the support substrate 3, as shown in FIG. 3, there is formed an opening section 31 at a portion corresponding to the mass section 21. The opening section 31 serves as a relief section for preventing the mass section 21 from being contacted with the support substrate 3 while the mass section 21 is being rotated (vibrated). Provision of the opening section (relief section) 31 enables preventing the size of the entire actuator 1 from being increased and enables an oscillating angle (amplitude) of the mass section 21 to be made larger.

Note that the relief section as described above need not be necessarily released (opened) at the bottom surface (i.e., the surface opposite to the mass section 21) of the support substrate 3 as long as the relief section has a structure having the advantageous effects as described above. Specifically, the relief section may be formed by a concave section formed on the top surface of the support substrate 3. In addition, the relief section need not be provided such as in the case where the depth of the space 28 of the mass section 21 is larger compared to the oscillating angle (amplitude) of the mass section 21.

In addition, on the support substrate 3, there are provided the pair of driving sources 4, 5 for rotating the mass section 21 at positions which correspond to the drive section 241. Specifically, the pair of driving sources 4, 5 are provided between the drive section 241 and the support substrate 3.

The driving source 4 and the driving source 5 are provided separately from each other with respect to the central axis X of rotation. Specifically, in FIG. 2, the driving source 4 is provided to the left of the central axis X of rotation, and the driving source 5 is provided to the right thereof.

The driving source 4 and the driving source 5 are respectively joined to the support substrate 3, and are provided slidably with respect to the drive section 241. As described above, the mass section 21 is supported with cantilever structure by the coupling section 24. Therefore, making the respective driving sources 4, 5 slidable with respect to the drive section 241 (i.e., coupling section 24) permits displacement of the coupling section 24 in a direction parallel to the central axis X of rotation caused by thermal expansion. This enables preventing a rapid change in a spring constant of the coupling section 24, and further keeping the central axis X of rotation of the mass section 21 fixed. Accordingly, the actuator 1 is capable of having desired vibration characteristics even in the cases such as where a light beam exceeding the light beam which was able to be reflected by the light reflective section 211 has increased the temperature of the actuator 1 or where heat emitted by the piezoelectric elements 41, 42 has increased the temperature of the actuator 1. That is, the actuator 1 is capable of maintaining desired vibration characteristics even in the case where it is used continuously for a long period of time.

The driving sources 4, 5 will now be described in details. Since the driving source 4 and the driving source 5 have similar structures (including shapes and dimensions), explanation will be given on the driving source 4 as a representative, and explanation on the driving source 5 will be omitted.

The driving source 4, as shown in FIG. 4, includes the piezoelectric element 41 and the sliding member 42.

The piezoelectric element 41 has a columnar structure which expands and contracts in the longitudinal direction thereof, and it is provided such that it expands and contracts in a direction perpendicular to a plane of the drive section 241 when the actuator 1 is not driven (i.e., in the vertical direction in FIG. 2). Furthermore, the bottom surface of the piezoelectric element 41 is joined to the support substrate 3.

Such piezoelectric element 41, as shown in FIG. 4, has a piezoelectric layer 411 mainly made of piezoelectric materials, and a pair of electrodes 412, 413 that sandwich the piezoelectric layer 411.

Examples of the piezoelectric materials which constitute the piezoelectric layer 411 include zinc oxide, aluminum nitride, lithium tantalate, lithium niobate, potassium niobate, lead zirconate titanate (PZT), barium titanate, and other various materials. One type may be used or more than one type may be combined for use for the piezoelectric materials. Particularly, it is preferable that at least one of zinc oxide, aluminum nitride, lithium tantalate, lithium niobate, potassium niobate and lead zirconate titanate be mainly used. Forming the piezoelectric layer 411 of such materials enables driving the actuator 1 at a higher frequency.

The electrode 412 is provided such that a part thereof is exposed from the bottom surface of the piezoelectric layer 411 (i.e., the lower end surface in FIG. 4). The electrode 413 has the same shape as the top surface of the piezoelectric layer 411 (i.e., the upper end surface in FIG. 3), and is provided on the top surface of the piezoelectric layer 411. In addition, the electrode 413 is connected to a terminal 414 provided on the support member 3 via a wiring formed by, for example, wire bonding. In addition, the electrode 412 and the electrode 413 (i.e., terminal 414) are respectively connected to a power source (voltage application means), not shown.

When voltage is applied to between the electrode 412 and the electrode 413 (i.e., terminal 414), the piezoelectric layer 411 expands and contracts in the longitudinal direction due to the piezoelectric effect thereof.

On the top surface of such piezoelectric element 41 (i.e., the surface opposite to the piezoelectric layer 411 of the electrode 413), there is provided the sliding member 42. Specifically, the sliding member 42 is provided between the piezoelectric element 41 and the drive section 241. In addition, the sliding member 42 is joined to the piezoelectric element 41, and is slidable with respect to the drive section 241. Provision of such sliding member 42 enables increasing the degree of freedom in design such as the contact position between the driving source 4 and the drive section 241, the shape of a contact portion or the like, and enabling achieving desired sliding performance between the drive section 241 and the driving source 4.

Although the sliding member 42 is joined to the piezoelectric element 41, the sliding member 42 is not limited to this structure and may instead be joined to the drive section 241. However, joining the sliding member 42 to the piezoelectric element 41 enables reducing the mass of the drive section 241 and rotating the drive section 241 at a higher speed, compared to a case where the sliding member 42 is joined to the drive section 241.

A distal end portion of the sliding member 42 (i.e., the end portion on the drive section 241 side) serves as a contact portion with the drive section 241, as shown in FIG. 1 or 3. The contact portion (i.e., distal end portion) is rounded in the direction perpendicular to the central axis X of rotation, as shown in FIG. 4. In this case, while the drive section 241 is rotated around the central axis X of rotation, the driving source 4 expands and contracts in the direction perpendicular to the plane of the drive section 241 when the driving source 4 is not driven. In other words, an angle created between the plane of the drive section 241 and the direction in which driving source 4 expands and contracts when the drive section 241 is rotated changes. That is, the contact position of the drive section 241 with the sliding member 42 slightly changes on the plane of the drive section 241 in the direction perpendicular to the central axis X of rotation. Therefore, rounding of the distal end portion enables enhancing following capability of the sliding member 42 with respect to rotation of the drive section 241.

The sliding member 42 makes a line contact with the drive section 241 such that the sliding member 42 extends in a direction parallel to the central axis X of rotation. This enables maintaining a contact area between the drive section 241 and the sliding member 42 (driving source 4) substantially constant during the rotation of the drive section 241. In addition, this enables preventing the position of the contact portion of the drive section 241 with the sliding member 42 from rapidly changing during the rotation of the drive section 241. This results in enabling smoothly rotating the drive section 241 while keeping the central axis X of rotation fixed.

On the other hand, there are some cases where, for example, the distal end of the sliding member 42 is formed of a flat plane, and the flat plane of the sliding member 42 makes a plane contact with the drive section 241 in the state where the actuator 1 is not driven. In such cases, when the drive section 241 is rotated, (1) in the same state as the non-driven state, the entire area of the flat plane of the sliding member 42 is contacted with the drive section 241. (2) In the state where the driving source 4 is in the expanded state, the end of the flat plane of the sliding member 42 which is the closest to the central axis X of rotation makes a point contact or line contact with the drive section 241. (3) In the state where the driving source 4 is in the contracted state (that is, in the case where the driving source 5 is in the expanded state), the end of the flat plane of the sliding member 42 which is the farthest from the central axis X of rotation makes a point contact or line contact with the drive section 241. Based on what has been described above, in the case where the sliding member 42 makes a plane contact with the drive section 241, the contact area therebetween changes, or the contact position of the drive section 241 with the sliding member 42 rapidly changes. This makes it difficult to smoothly rotate the drive section 241.

The sliding member 42 is provided such that, in the direction parallel to the central axis X of rotation, the length of the distal end (i.e., the portion to be contacted with the drive section 242) of the sliding member 42 is longer than the length of the contact portion of the drive section 242 with the sliding member 42, and such that the distal end of the sliding member 42 is contacted with the entire area of the drive section 241. This enables the sliding member 42 to make a line contact with the entire area of the drive section 241 in the direction parallel to the central axis X of rotation, even in the case where the coupling section 24 expands or contracts caused by a change in temperature, and along with the expansion and contraction the position of the drive section 241 is displaced in the direction parallel to the central axis X of rotation with respect to the sliding member 42. That is, this enables rotating the drive section 241 while keeping the central axis X of rotation fixed without being affected by change in temperature of the actuator 1.

In addition, the sliding member 42 makes a line contact with the entire area of the drive section 241 in the direction parallel to the central axis X of rotation, which enables uniformly applying driving force of the driving source 4 to the entire area of the drive section 241 in the direction parallel to the central axis X of rotation. In addition, this readily makes the contact portion between the driving source 4 and the drive section 241 and the contact portion between the driving source 5 and the drive section 241 symmetric with each other with respect to the central axis X of rotation. This results in enabling simplifying manufacture of the actuator 1 and rotating the drive section 241 symmetrically with respect to the central axis X of rotation.

In this case, it is preferable that the contact pressure between the sliding member 42 and the drive section 241 be substantially 0 when the actuator 1 is not driven. This enables preventing displacement of the central axis X of rotation caused by warping of the coupling section 24 in the direction perpendicular to the plane of the mass section 21. Note that the structure is not particularly limited to the above, as long as the driving force of the driving source 4 can be transmitted to the drive section 241. For example, the structure may be such that the sliding member 42 is not contacted with the drive section 241 when the actuator 1 is not driven and the sliding member 42 is contacted with the drive section 241 when the piezoelectric element 41 has expanded.

The distal end portion (i.e., the contact portion with the drive section 241) of the sliding member 42 and the contact portion of the drive section 241 with the sliding member 42 are surface treated to enhance sliding performance. This enables enhancing sliding performance of the drive section 241 with respect to the sliding member 42. That is, this enables reducing friction (sliding resistance) between the sliding member 42 and the drive section 241. Specifically, as shown in FIG. 2, a coating layer P is formed on each of the distal end portion of the sliding member 42 and the contact portion of the drive section 241 with the sliding member 42.

Examples of materials that are capable of reducing such friction include polyolefin such as polyethylene and polypropylene, polyvinyl chloride, polyester (such as PET, PBT), polyamide, polyimide, polyurethane, polystyrene, polycarbonate, silicone resin, fluorinated resin (such as PTFE, ETFE), and composite materials thereof.

Above all, in the case where a fluorinated resin (or a composite material including the same) is used, friction resistance between the sliding member 42 and the drive section 241 is reduced, whereby sliding performance is enhanced.

In addition, in the case where fluorinated resin (or a composite material including the same) is used, the sliding member 42 and the drive section 241 may be coated in the state where resin material has been heated using a method such as baking and spraying. This provides particularly superior adhesiveness of the coating layer P.

In addition, in the case where the coating layers P are formed of silicone resin (or a composite material including the same), reliably and strongly adhered coating layers P can be formed without heating at a time of forming a coating layer P (i.e., coating the sliding member 42 and the drive section 241). Specifically, in the case where the coating layer P is formed of silicone resin (or a composite material including the same), reactive curing materials or the like can be used, and thus the coating layer P can be formed at a room temperature. As described above, forming of the coating layer P at a room temperature makes coating simple.

Note that the surface treatments for enhancing sliding performance are not limited to those described above. For example, the surface treatment may roughen the surface of the distal end portion of the sliding member 42 and the surface of the contact portion of the drive section 241 with the sliding member 42, respectively. In addition, in Embodiment 1, explanation has been given on the case where the coating layer P is formed on each of the distal end portion of the sliding member 42 and the contact portion of the drive section 241 with the sliding member 42. However, at least either one of the two surfaces need be treated. Alternatively, such a surface treatment may be omitted.

Such sliding member 42 has a lower heat conductivity than the component of the piezoelectric element 41. This enables suppressing transmission to the drive section 241 of heat which is generated by application of voltage to the piezoelectric element 41. This enables suppressing thermal expansion of the coupling section 24 caused by increased temperature.

Although such materials are not particularly limited, various thermoplastic resins or various thermosetting resins may be used. Above all, it is particularly preferable that thermosetting resins be used. Thermosetting resins have good heat resistance and hardness and are difficult to degenerate or denature. This enables preventing the sliding member 42 from being deformed by heat generated by the piezoelectric element 41. Such thermosetting resins are not particularly limited, and, for example, polyimide resins, phenol resins, epoxy resins, unsaturated polyester resins, urea resins, melamine resins, diallyl phthalate resins or the like may be preferably used.

In addition, forming the sliding member 42 of a material capable of reducing friction as described above enables omitting the process of surface treatment as described above, and thus simplifying the manufacturing process.

Hereinbefore, explanation has been given on the sliding member 42. The shape of the sliding member 42 is not particularly limited, as long as the shape enables driving the drive section 241. For example, the sliding member 42 may make a point contact with the drive section 241. As is the case with the line contact as described above, the point contact enables maintaining the contact area of the drive section 241 with the sliding member 42 substantially constant when the drive section 241 is rotated. In addition, this enables preventing the position of the contact portion of the drive section 241 with the sliding member 42 from rapidly changing during rotation of the drive section 241. This results in enabling rotating the drive section 241 smoothly and stably.

Although explanation has been given on the driving source 4 hereinbefore, the driving source 5 has a similar structure as the driving source 4. Specifically, the driving source 5 has the piezoelectric element 51 and the sliding member 52. Such driving source 4 and driving source 5 are provided such that they are symmetrical with each other with respect to the central axis X of rotation. This enables rotating the drive section 241 symmetrically with respect to the central axis X of rotation.

The actuator 1 with a structure as described above is driven as described below.

For example, voltage as shown in FIG. 5A is applied to the piezoelectric element 41, and voltage as shown in FIG. 5B is applied to the piezoelectric element 51. Specifically, each of two voltages having 180° phase difference is applied to the piezoelectric element 41 and the piezoelectric element 51. Next, the actuator 1 alternately repeats a state in which the piezoelectric element 41 is expanded and the piezoelectric element 51 is contracted (i.e., the state is referred to as "the first state") and a state in which the piezoelectric element 41 is contracted and the piezoelectric element 51 is expanded (i.e., the state is referred to as "the second state").

In the first state, in FIG. 2, expansion of the piezoelectric element 41 causes a portion to the left of the central axis X of rotation of the drive section 241 to be inclined upwards and a portion to the right thereof to be inclined downwards. That is, the drive section 241 is rotated clockwise in FIG. 2.

On the other hand, in the second state, in FIG. 2, expansion of the piezoelectric element 51 causes a portion to the right of the central axis X of rotation of the drive section 241 to be inclined upwards and a portion to the left thereof to be inclined downwards. That is, the drive section 241 is rotated counter-clockwise in FIG. 2.

Alternate repeating of such first state and second state enables rotation of the drive section 241 around the central axis X of rotation while torsionally deforming the first elastic section 242, and along with the rotation, enables rotating the mass section 21 around the central axis X of rotation while torsionally deforming the second elastic section 243. Note that expansion and contraction of the piezoelectric elements 41, 51 in phases opposite to each other enabling rotating the drive section 241 while keeping the central axis X of rotation fixed.

In addition, since driving force is obtained from the piezoelectric elements, the actuator 1 can be driven with relatively large driving force even when the actuator 1 is driven at low voltage drive. This enables enhancing a spring constant of the first elastic section 242 so as to drive the actuator at a high frequency even when the actuator 1 is driven at low voltage drive.

Such actuator 1 can be manufactured, for example, as described below.

FIGS. 6 and 7 are diagrams (in longitudinal sectional view) for describing a method of manufacturing the actuator 1 according to Embodiment 1, respectively. Hereinafter, for convenience of description, in FIGS. 6 and 7, the front side of a plane of the drawing will be referred to as "top," and the back side thereof as "bottom." In addition, the process of obtaining the base body 2 is referred to as "A1," the process of obtaining the support substrate 3 as "A2," the process of joining the driving sources 4, 5 to the support substrate 3 as "A3," and the process of joining the base body 2 to the support substrate 3 as "A4.".

A1

Figure 6A:
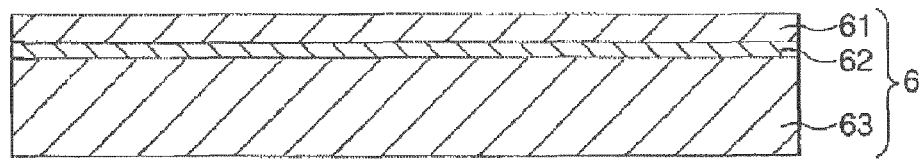
FIGS. 6A-6D are diagrams explaining a manufacturing method of the actuator.
Figure 6B:
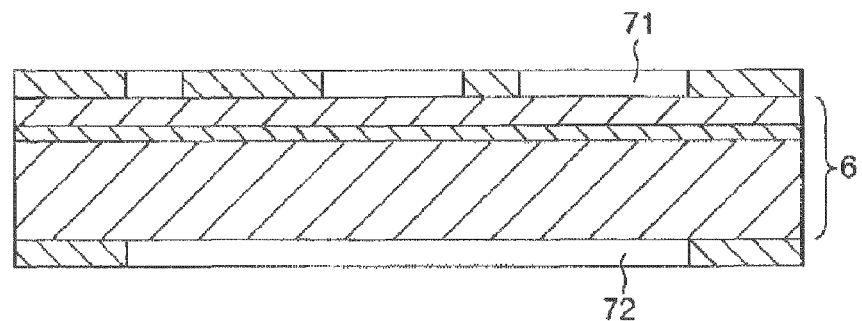

First, as shown in FIG. 6A, a silicon-on-insulator substrate (SOI substrate) 6 in which an Si layer 61, an $SiO_2$ layer 62, and an Si layer 63 are sequentially laminated is prepared. Next, as shown in FIG. 6B, on the top surface of the Si layer 61 of the SOI substrate 6, there is formed a resist mask 71 which has a shape corresponding to the shape in plan view of the mass section 21, the support section 22, and the coupling section 24. On the other hand, on the bottom surface of the Si layer 63 of the SOI substrate 6, there is formed a resist mask 72 which has a shape corresponding to the shape in plan view of the support section 22 (space 28). Next, the SOI substrate 6 is etched via the resist mask 71. Subsequently, the resist mask 71 is removed. In a similar manner, the SOI substrate 6 is etched via the resist mask 72. At this time, the $SiO_2$ layer 62 which is an intermediate layer of the SOI substrate 6 functions as a stop layer of etching as described above.

As an etching method, for example, one type may be used or more than one type may be combined for use from a physical etching method such as plasma etching, reactive ion etching, beam etching, photo-assisted etching and a chemical etching method such as wet etching. Note that a similar method may also be used in each of the following processes.

Figure 6C:
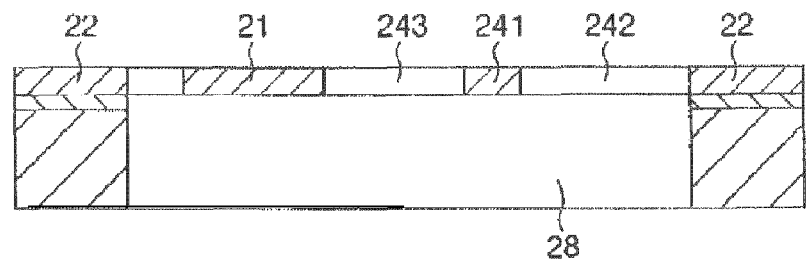

Subsequently, the $SiO_2$ layer 62 is removed, and as shown in FIG. 6C, the mass section 21, the support section 22 and the coupling section 24 may be integrally formed.

Figure 6D:
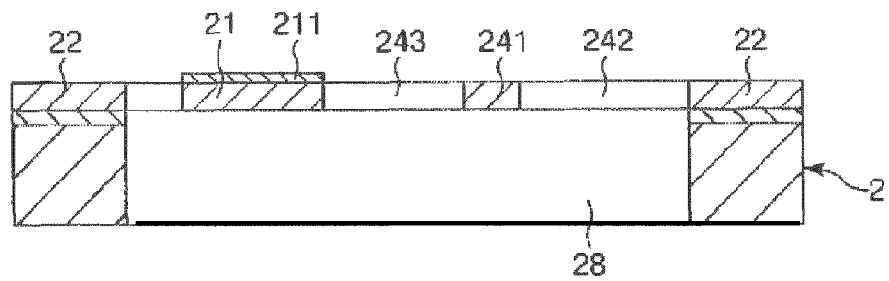

Next, as shown in FIG. 6D, a metal film is formed on the top surface of the mass section 21 to form the light reflective section 211. This enables obtaining the base body 2. Examples of the method of forming the metal film (light reflective section 211) include a dry plating method such as vacuum deposition, sputtering (low-temperature sputtering) and ion plating, a wet plating method such as electrolytic plating and electroless plating, a spraying method, joining of metallic foil and the like.

A2

Figure 7A:
FIGS. 7A-7E are diagrams explaining a manufacturing method of the actuator.
Figure 7B:
Figure 7C:

First, as shown in FIG. 7A, a silicon substrate 9 is prepared. Next, as shown in FIG. 7B, on the top surface of the silicon substrate 9, there is formed a resist mask 73 which has a shape corresponding to the opening section 31 in plan view. Next, the silicon substrate 9 is etched via the resist mask 73. Subsequently, the resist mask 73 is removed, and as shown in FIG. 7C, the support substrate 3 can be obtained.

A3

First, the piezoelectric element 41 is prepared. Subsequently, the sliding member 42 is joined to the one end of the piezoelectric element 41 in the directions in which the piezoelectric element 41 contracts and expands, whereby the driving source 4 is obtained. Note that, as a manufacturing method of the piezoelectric element 41, for example, the piezoelectric element 41 may be formed by, for example, forming the piezoelectric layer 411 having a certain thickness (length in the directions in which the piezoelectric element 41 contracts and expands) and then by joining the thin-film based electrodes 412, 413 to both surfaces in the thickness direction, respectively. The same is applied to the driving source 5.

Figure 7D:
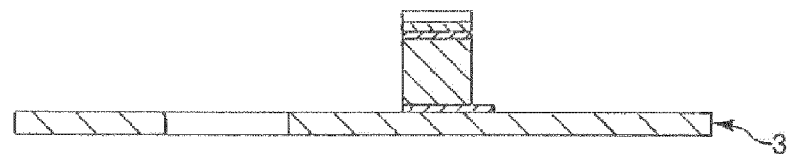

Next, as shown in FIG. 7D, the surface of the driving source 4 opposite to the sliding member 42 is joined to a portion corresponding to the drive section 241 on the top surface of the support substrate 3. The same is applied to the driving source 5.

A4

Figure 7E:
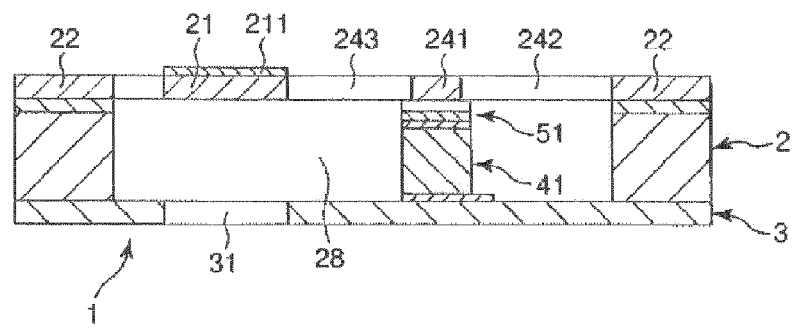

Next, as shown in FIG. 7E, the bottom surface (i.e., support section 22) of the base body 2 obtained in the process "A1" is joined to the top surface of the support substrate 3 on which there are provided the driving sources 4, 5 obtained in the process "A3." The joining method is not particularly limited, and for example, anodic bonding may be used for joining. According to the manner as described above, the actuator 1 of Embodiment 1 is manufactured.

Embodiment 2

Embodiment 2 of the actuator according to the invention will now be described.

Figure 8:
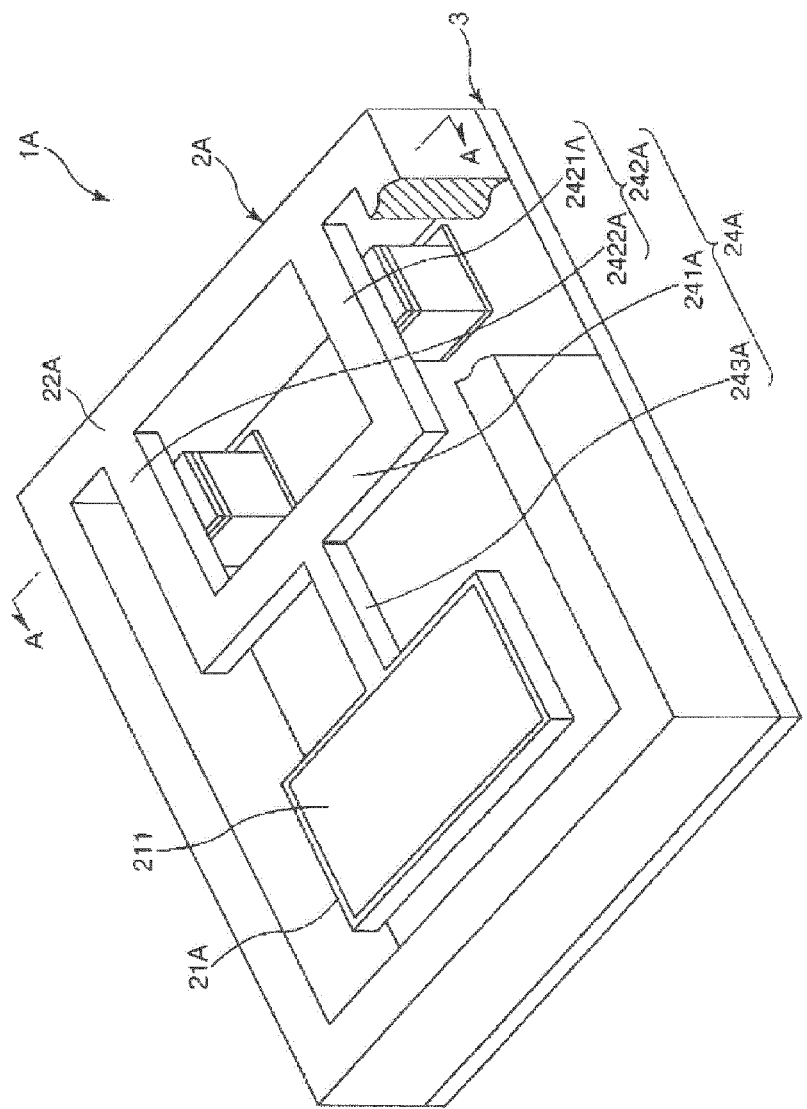
FIG. 8 shows Embodiment 2 of the actuator according to the invention.
Figure 9:
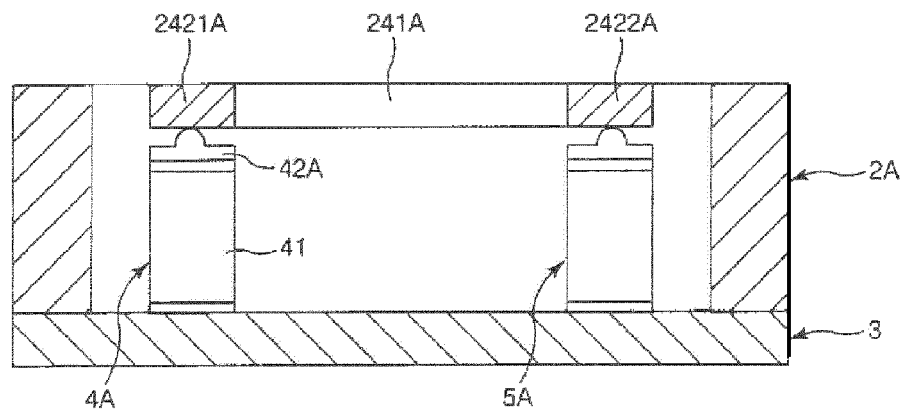
FIG. 9 is a sectional view cut along Line A-A in FIG. 8.
Figure 10:
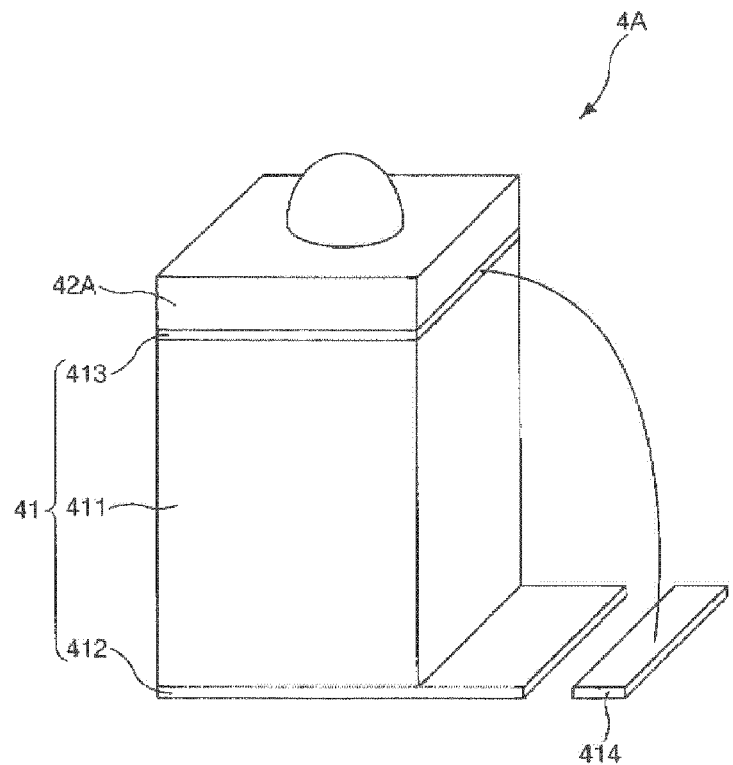
FIG. 10 is an expanded view of a driving source.

FIG. 8 is a partially sectional perspective view showing Embodiment 2 of the actuator according to the invention, FIG. 9 is a sectional view cut along Line A-A in FIG. 8, and FIG. 10 is an expanded view of a driving source. Hereinafter, for convenience of description, in FIG. 8, the front side of a plane of the drawing will be referred to as "top," the back side thereof as "bottom," the right side thereof as "right," and the left side thereof as "left." In FIG. 9, the top side of a plane of the drawing will be referred to as "top," the bottom side thereof as "bottom", the right side thereof as "right," and the left side thereof as "left."

Hereinafter, for convenience of description, in FIG. 1, the front side of a plane of the drawing will be referred to as "top," the back side thereof as "bottom," the right side thereof as "right," and the left side thereof as "left." For FIGS. 2 and 3, the top side of a plane of the drawing will be referred to as "top," the bottom side thereof as "bottom", the right side thereof as "right," and the left side thereof as "left."

Hereinafter, an actuator 1A of Embodiment 2 will be described focusing on the difference from the actuator 1 of Embodiment 1 as described above, and explanation on similar elements will be omitted.

The actuator 1A of Embodiment 2 is substantially same as the actuator 1 of Embodiment 1, except the difference in the structure of a base body 2A and in the shapes of a pair of driving sources 4A, 5A.

Specifically, the base body 2A has a mass section 21A, a support section 22A for supporting the mass section 21A and a coupling section 24A for coupling the mass section 21A rotatably to the support section 22A.

The coupling section 24A has a branched section 241A which extends in the direction perpendicular to the central axis X of rotation in plan view of the mass section 21, a first elastic section 242A for coupling the branched section 241A to the support section 22A, and a second elastic section 243A for coupling the mass section 21A to the branched section 241A.

The first elastic section 242A includes a pair of elastic members 2421A, 2422A which are provided so as to be opposed to each other with respect to the central axis X of rotation. The elastic member 2421A couples one end of the branched section 241A in the direction in which the branched section 241A extends to the support section 22A, and the elastic member 2422A couples the other end of the branched section 241A in the direction in which the branched section 241A extends to the support section 22A. In addition, the elastic member 2421A and the elastic member 2422A respectively extend in the direction parallel to the central axis X of rotation. That is, the coupling section 24A has a structure such that it is branched into two sections.

Such actuator 1A causes the piezoelectric element 41 to expand and contract causing bending deformation of the elastic member 2421A, and causes the piezoelectric element 51 to expand and contract causing bending deformation of the elastic member 2422A. Next, the actuator 1A causes the piezoelectric element 41 and the piezoelectric element 51 alternately expand and contract to rotate the branched section 244A. Along with the rotation, the actuator 1A rotates the mass section 21A while torsionally deforming the second elastic section 243A. At this time, the mass section 21A is rotated centering around the central axis X of rotation shown in FIG. 8.

The driving source 4A is provided between the support substrate 3 and the elastic member 2421A, is joined to the support substrate 3, and is slidable with respect to the elastic member 2421A. In a similar manner, the driving source 5A is provided between the support substrate 3 and the elastic member 2422A, is joined to the support substrate 3, and is slidable with respect to the elastic member 2422A.

The driving sources 4A, 5A will now be described in details. Since the driving source 4A and the driving source 5A have similar structures (including shapes and dimensions), explanation will be given on the driving source 4A as a representative, and explanation on the driving source 5A will be omitted.

The driving source 4A, as shown in FIG. 10, includes the piezoelectric element 41 and the sliding member 42A. The piezoelectric element 41 has a columnar structure which expands and contracts in the longitudinal direction thereof, and it is provided such that it expands and contracts in a direction perpendicular to a plane of the drive section 241 when the actuator 1A is not driven (i.e., in the vertical direction in FIG. 9). Furthermore, the bottom surface of the piezoelectric element 41 is joined to the support substrate 3.

On the top surface of such piezoelectric element 41, there is provided the sliding member 42A. The sliding member 42A is joined to the piezoelectric element 41, and is slidable with respect to the elastic member 2421A.

Such sliding member 42A makes a point contact with the elastic member 2421A. This enables enhancing following capability of the sliding member 42A with respect to rotation of the drive section 2421A when the piezoelectric element 41 is caused to expand and contract. Specifically, mainly bending deformation is generated in the elastic member 2421A because of expansion and contraction of the piezoelectric element 41. Since the branch section is rotated along with the expansion and contraction, slight torsional deformation is also generated. Therefore, making a point contact of the sliding member 42 with the elastic member 2421A enables causing bending deformation of the elastic member 2421A without being affected by torsional deformation of the elastic member 2421A.

Hereinbefore, explanation has been given on the actuators according to the embodiments of the invention. Since the actuators according to the invention include a light reflective section, they may be applied to an optical device such as an optical scanner, an optical switch, and an optical attenuator.

As is the case with the actuator 1 according to the embodiment of the invention, an optical scanner 1B according to the embodiments of the invention has a mass section, a light reflective section provided in the mass section, a support section, a coupling section for supporting the mass section with cantilever structure, and a pair of driving sources which are provided slidably with respect to the coupling section. Such optical scanner causes the piezoelectric element each driving source has to expand and contract in the phases opposite to each other to torsionally deform at least a part of the coupling section, causing rotating the mass section and scanning a light beam by the light reflective section. The structure of the coupling section and the structure of each driving source are similar to those of the actuator 1 according to the embodiment of the invention. This enables permitting the coupling section from being displaced because of thermal expansion in the direction parallel to the central axis of rotation of the mass section. This results in enabling preventing a rapid change in a spring constant of the coupling section, and further keeping the central axis of rotation of the mass section fixed. Accordingly, the optical scanner according to the embodiment of the invention is capable of having desired scan characteristics even in the cases such as where a light beam exceeding the light beam which was able to be reflected by the light reflective section 211 has increased the temperature of the optical scanner or where heat emitted by the piezoelectric elements has increased the temperature of the optical scanner. That is, the optical scanner according to the embodiment of the invention is capable of maintaining desired scan characteristics even in the case where it is used continuously for a long period of time.

Such an optical scanner may be preferably applied to an image forming apparatus, such as a laser printer, an imaging display, a bar-code reader, and a confocal scanning microscope. This results in enabling providing the image forming apparatus having superior drawing characteristics.

Figure 11:
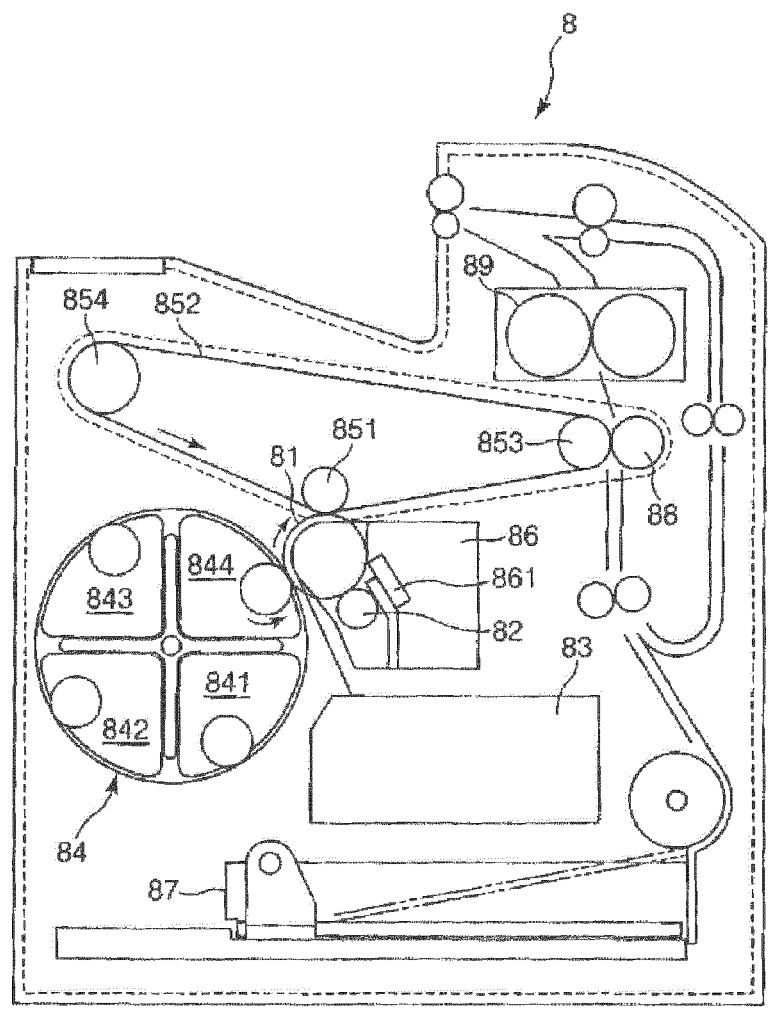
FIG. 11 is a schematic view of a laser printer.

Specifically, a laser printer as shown in FIG. 11 will be explained.

A laser printer (i.e., image forming apparatus) 8 of the present embodiment as shown in FIG. 11 records an image in a recording medium through a series of image forming processes mainly including exposure, development, transfer and fixation. Such image forming apparatus 8, as shown in FIG. 11, has a photoreceptor 81 which carries an electrostatic latent image and which is rotated in a direction shown by an arrow, and in the image forming apparatus 8. In addition, a charged unit 82, an exposure unit 83, a development unit 84, a primary transfer roller 851, and a cleaning unit 86 are sequentially arranged along the direction in which the photoreceptor is rotated. In addition, at the lower portion of the laser printer 8 shown in FIG. 11, there is arranged a paper feed tray 87 for accommodating a recording medium such as paper. Downstream of the paper feed tray 87 in the direction in which the recording medium is transferred, there are sequentially arranged a secondary transfer roller 88, and a fixation unit 89 along the direction in which the recording medium is transferred.

The photoreceptor 81 has a cylindrical conducting base material (not shown) and a photosensitive layer (not shown) formed on the peripheral surface thereof, and is rotatable around the axis line thereof in the direction shown by the arrow in FIG. 11.

The charged unit 82 is an apparatus for uniformly charging the surface of the photoreceptor 81 using corona electrification or the like.

Figure 12:
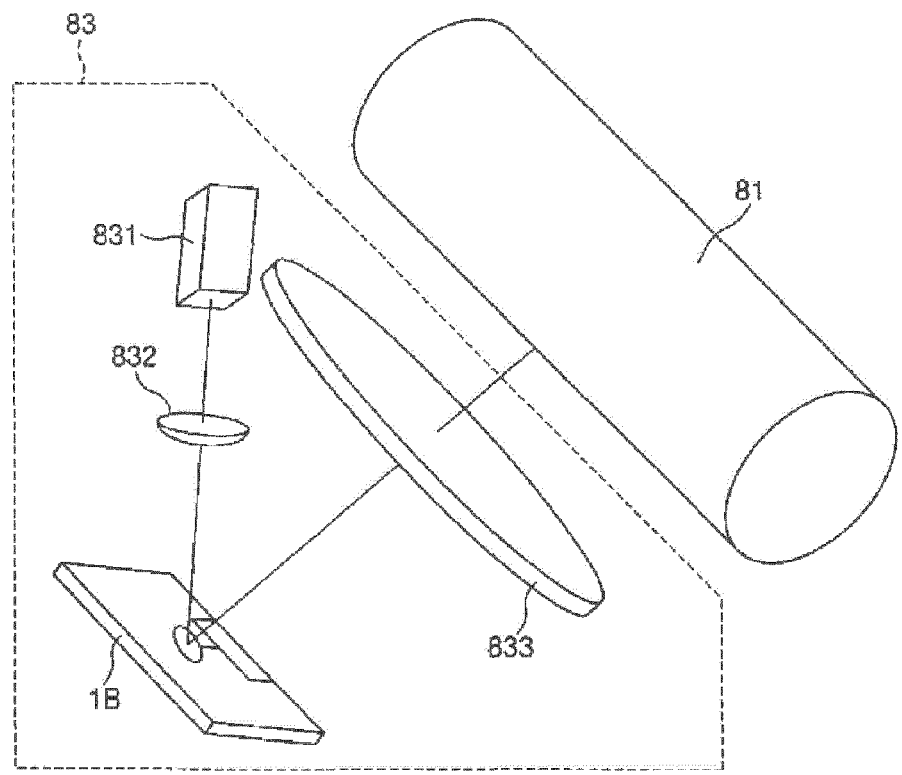
FIG. 12 is a schematic view of an exposure unit.

The exposure unit 83 is an apparatus which receives image information from a host computer such as a personal computer, not shown, and irradiates a laser beam on the uniformly charged photoreceptor (photoconductive drum) 81 in response to the image information, thereby forming an electrostatic latent image. Specifically, as shown in FIG. 12, the exposure unit 83 has the optical scanner 1B according to the embodiment of the invention, a light source 831 for irradiating a light beam to the light reflective section of the optical scanner 1B, a focus lens 832 for focusing a light beam which has been irradiated from the light source 831 to the light reflective section, and an f θ lens 833 for changing a speed of the light beam reflected by the light reflective section. This enables the exposure unit 83 to scan (irradiate) a light beam at a desired scanning position of the object to be scanned (photoreceptor 81), thereby enables forming a desired latent image. As a result of this, the image forming apparatus according to the embodiment of the invention is capable of having superior drawing characteristics. Note that the structure of the exposure unit 83 is not limited to this.

The development unit 84 has four development units: a black development unit 841, a magenta development unit 842, a cyan development unit 843, and a yellow development unit 844, and is rotatable so as to be opposed to the photoreceptor 81.

The operation the laser printer 8 with a structure as described above will now be described.

First, the photoreceptor 81, the development roller (not shown) provided on the development unit 84, and an intermediate transfer belt 852 start rotation triggered by a command from the host computer, not shown. Next, the photoreceptor 81 is sequentially charged by the charged unit 82, while it is being rotated.

A charged area of the photoreceptor 81 reaches an exposure position along with the rotation of the photoreceptor 81. A latent image corresponding to the image information for the first color, for example yellow Y, is formed in the area by the exposure unit 83.

The latent image formed on the photoreceptor 81 reaches a development position along with the rotation of the photoreceptor 81, and is developed by the yellow development unit 844 on the yellow toner. This forms a yellow toner image on the photoreceptor 81. At this time, in the YMCK development unit 84, the yellow development unit 844 is opposed to the photoreceptor 81 at the development position.

The yellow toner image formed on the photoreceptor 81 reaches a primary transfer position (that is, the portion at which the photoreceptor 81 is opposed to the primary transfer roller 851) along with the rotation of the photoreceptor 81, and is transferred (i.e., primarily-transferred) to the intermediate transfer belt 852 by the primary transfer roller 851. At this time, primary transfer voltage (i.e., primary transfer bias) with a polarity opposite to the charge characteristics of the toner is applied to the primary transfer roller 851. Note that, during this period of time, the secondary transfer roller 88 is separated from the intermediate transfer belt 852.

The processing similar to that described above is repeatedly carried out for the second color, the third color and the fourth color, whereby toner images for respective colors corresponding to respective image signals are transferred on the intermediate transfer belt 852 in a manner such that the toner images are overlapped with each other. This enables forming a full-color toner image on the intermediate transfer belt 852.

Meanwhile, the recording medium is transferred from the paper feed tray 87 to the secondary transfer roller 88.

The full-color toner image formed on the intermediate transfer belt 852 reaches a secondary transfer position (that is, the portion at which the secondary transfer roller 88 is opposed to the drive roller 853) along with rotation of the intermediate transfer belt 852, and is transferred (i.e., secondarily-transferred) on a recording medium P by the secondary transfer roller 88. At this time, the secondary transfer roller 88 is pressed to the intermediate transfer belt 852, and secondary transfer voltage (i.e., secondary transfer bias) is applied to the secondary transfer roller 88.

The full-color toner image transferred on the recording medium is heated and pressurized by the fixation unit 89 so as to be fused to the recording medium P. Subsequently, the recording medium is ejected to outside of the laser printer 8.

Meanwhile, after the photoreceptor 81 has passed the primary transfer position, the toner attached to the surface thereof is scraped off by a cleaning blade 861 of the cleaning unit 86, and then the photoreceptor 81 gets ready for a charge for forming a next latent image. The toner which has been scraped off is collected by a residual toner collection section in the cleaning unit 86.

Hereinbefore, the actuator, the optical scanner and the image forming apparatus according to the invention have been described referring to the embodiments as shown in the drawings. However, the invention is not limited to this.

For example, a structure for each section of the actuator according to the embodiment of the invention may be replaced by one with arbitrary structure which has similar functions, or arbitrary structure may be added to the actuator.

Furthermore, in the embodiments described above, the elastic member has a linear shape. However, as long as the drive section can be rotated by causing bending deformation of a pair of elastic members in the directions opposite to each other, the elastic member may have an arbitrary shape.

Furthermore, in the embodiments described above, the structure having a shape substantially symmetrical (i.e., bilaterally symmetrical) with respect to the plane which passes through the center of the actuator and which is perpendicular to the rotation axis line of the mass section and the pair of drive sections has been described. However, the structure may instead be asymmetrical.

Furthermore, in the embodiments described above, the structure in which the light reflective section is provided on the top surface of the mass section has been described. However, the structure may have a structure, for example, it provided in the opposite manner. That is, the light reflective section may be provided on the back side of the mass section.

What is claimed is:

1. An actuator comprising:
    a mass section;
    a support section;
    a coupling section for coupling the mass section rotatably to the support section; and
    a pair of driving sources including a piezoelectric element rotating the mass section, wherein:
        the pair of driving sources are provided separately from each other with respect to a central axis of rotation of the mass section,
        each of the driving sources is provided slidably with respect to the coupling section or the support section, and
        the actuator causes the pair of piezoelectric elements to expand and contract in phases opposite to each other, so as to rotate at least a part of the coupling section while torsionally deforming the mass section.

2. The actuator according to claim 1, wherein:
    each of the driving sources is secured to the support section and further includes a sliding member between the piezoelectric element and the coupling section, and
    the sliding member is joined to the piezoelectric element on which the sliding member is provided and is slidable with respect to the coupling section.

3. The actuator according to claim 2, wherein the sliding member has a lower heat conductivity than a primary component of the piezoelectric element.

4. The actuator according to claim 1, wherein surface treatment is provided on a surface of an abutting section of each of the driving sources with the coupling section and/or a surface of the abutting section of the coupling section with each of the driving sources to enhance sliding performance.

5. The actuator according to claim 1, wherein:
    the coupling section has a plate-shaped drive section, a first elastic section for coupling the drive section rotatbly to the first support section, and a second elastic section for coupling the mass section rotatably to the drive section, and
    each of the driving sources is provided slidably with respect to the drive section.

6. The actuator according to claim 5, wherein each of the driving sources makes a point contact with the drive section, or makes a line contact therewith so that it extends in a direction parallel to the central axis of rotation of the mass section.

7. The actuator according to claim 6, wherein each of the driving sources makes a line contact with the entire area of the drive section in the direction parallel to the central axis of rotation of the mass section.

8. The actuator according to claim 5, wherein the pair of driving sources are provided substantially symmetrically with each other with respect to the central axis of rotation of the mass section in plan view of the drive section.

9. The actuator according to claim 1, wherein:
    the elastic section has a pair of elastically deformable elastic members that are opposed to each other with respect to the central axis of rotation of the mass section,
    the pair of driving sources are provided corresponding to the pair of elastic members, respectively, and
    the driving source and the elastic member that correspond to each other are slidably provided.

10. The actuator according to claim 9, wherein each of the driving sources makes a point contact with the elastic member.

11. The actuator according to claim 1, wherein the mass section includes a light reflective section having light reflectivity.

12. An optical scanner comprising:
    a mass section;
    a support section;
    a coupling section for coupling the mass section rotatably to the support section; and
    a pair of driving sources including a piezoelectric element rotating the mass section, wherein:
        the pair of driving sources are provided separately from each other with respect to a central axis of rotation of the mass section,
        each of the driving sources is provided slidably with respect to the coupling section or the support section, and
        the optical scanner causes the pair of piezoelectric elements to expand and contract in phases opposite to each other, so as to rotate at least a part of the coupling section while torsionally deforming the mass section, and scans a light beam reflected by the light reflective section.

13. An image forming apparatus comprising an optical scanner including:
    a mass section;
    a support section;
    a coupling section for coupling the mass section rotatably to the support section; and
    a pair of driving sources including a piezoelectric element rotating the mass section, wherein:
        the pair of driving sources are provided separately from each other with respect to a central axis of rotation of the mass section,
        each of the driving sources is provided slidably with respect to the coupling section or the support section, and
        the optical scanner causes the pair of piezoelectric elements to expand and contract in phases opposite to each other, so as to rotate at least a part of the coupling section while torsionally deforming the mass section, and scans a light beam reflected by the light reflective section.

* * * * *